(12) United States Patent
Kim et al.

(10) Patent No.: US 7,529,439 B2
(45) Date of Patent: May 5, 2009

(54) OPTICAL PRINTED CIRCUIT BOARD AND FABRICATING METHOD THEREOF

(75) Inventors: Joon-Sung Kim, Suwon-si (KR); Je-Gwang Yoo, Yongin-si (KR); Han-Seo Cho, Daejeon (KR); Sang-Hoon Kim, Gunpo-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 11/889,327

(22) Filed: Aug. 10, 2007

(65) Prior Publication Data
US 2008/0037929 A1 Feb. 14, 2008

(30) Foreign Application Priority Data
Aug. 14, 2006 (KR) ...................... 10-2006-0076807

(51) Int. Cl.
*G02B 6/12* (2006.01)
*G02B 6/32* (2006.01)

(52) U.S. Cl. .............................. 385/14; 385/33; 385/15; 385/31; 385/32

(58) Field of Classification Search ............. 385/31–52, 385/76–92, 14–18
See application file for complete search history.

(56) References Cited

U.S. PATENT DOCUMENTS

| | | | | |
|---|---|---|---|---|
| 5,263,111 A | * | 11/1993 | Nurse et al. ................. | 385/130 |
| 5,387,269 A | * | 2/1995 | Nijander et al. ............... | 65/386 |
| 6,888,169 B2 | * | 5/2005 | Malone et al. ................ | 257/82 |
| 6,970,610 B2 | * | 11/2005 | Iwasaki ....................... | 385/14 |
| 7,112,885 B2 | * | 9/2006 | Chen et al. ................... | 257/728 |
| 7,125,176 B1 | * | 10/2006 | Stafford et al. ................ | 385/94 |
| 7,346,242 B2 | * | 3/2008 | Morlion et al. ............... | 385/52 |
| 7,366,375 B2 | * | 4/2008 | Ohtorii ........................ | 385/33 |

FOREIGN PATENT DOCUMENTS

| | | |
|---|---|---|
| JP | 2001-166167 | 6/2001 |
| JP | 2005-234455 | 9/2005 |

OTHER PUBLICATIONS

Korean Patent Office Action, mailed Aug. 20, 2007 and issued in corresponding Korean Patent Application No. 10-2006-0076807.

* cited by examiner

*Primary Examiner*—Brian Healy
*Assistant Examiner*—Guy G Anderson (57) ABSTRACT

An optical printed circuit board which can transfer optical signal and electric signals simultaneously, and a method of fabricating the optical printed circuit board. An optical printed circuit board which includes an upper cladding layer, a core layer positioned in the upper cladding layer that has a first reflecting surface and a second reflecting surface at both ends to guide optical signals, a lower cladding layer of which one side is in contact with the upper cladding layer and which has a circuit pattern and light connecting bumps on the other side corresponding to the first reflecting surface and the second reflecting surface, may provide the advantage of high optical connection efficiency.

7 Claims, 11 Drawing Sheets

OPTICAL PRINTED CIRCUIT BOARD AND FABRICATING METHOD THEREOF

CROSS-REFERENCE TO RELATED APPLICATIONS

This application claims the benefit of Korean Patent Application No. 10-2006-0076807 filed with the Korean Intellectual Property Office on Aug. 14, 2006, the disclosure of which is incorporated herein by reference in its entirety.

BACKGROUND

1. Technical Field

The present invention relates to an optical printed circuit board which can transfer optical signal and electric signals simultaneously, and a method of fabricating the optical printed circuit board.

2. Description of the Related Art

Optical connection technology is widely used in data transmission between systems separated several to several hundreds of meters, data bus transmission between back planes in systems separated several tens of centimeters to several meters, connection between boards separated several tens of centimeters, and data links between chips separated several to several tens of centimeters, etc.

Various connecting methods are used, such as using free space connection, optical fiber ribbons, and polymer optical waveguides, etc. In order to apply optical connection to boards having a relatively short transmission distance, the connecting method should be improved to be applicable to present printed circuit board technology.

An optical printed circuit board according to prior art is disclosed in Korean patent publication No. 10-2005-0072736. The optical printed circuit board has dielectric layers formed on both sides of the optical waveguide respectively and a reflecting surface that refracts the incident light vertically. Also, transmission chips and receipt chips are mounted at the circuit pattern formed in the printed circuit board. On the chips, VCSEL's (Vertical-Cavity Surface-Emitting Lasers) or photodiodes are protruded downward, so that light is irradiated or received in the reflecting surface. The irradiated light is refracted at the reflecting surface to be transmitted through the optical waveguide.

The optical waveguide according to the prior art has a gap between the photodiode or VCSEL and dielectric layer, so that optical connection efficiency is decreased due to the diffusing property of light irradiated or refracted on the VCSEL or the photodiode. Also, the surface of the dielectric layer is given roughness in order to form a metal layer easily, but such a roughened surface leads to light loss.

SUMMARY

An aspect of the present invention aims to provide an optical printed circuit board having a high optical connection efficiency and a method of fabricating the optical printed circuit board.

One aspect of the invention provides an optical printed circuit board which includes an upper cladding layer, a core layer positioned in the upper cladding layer that has a first reflecting surface and a second reflecting surface at both ends to guide optical signals, a lower cladding layer of which one side is in contact with the upper cladding layer and which has a circuit pattern and light connecting bumps on the other side corresponding to the first reflecting surface and the second reflecting surface.

An optical printed circuit board according to embodiments of the invention may include one or more of the following features. For example, the light connecting bump can be shaped as a protrusion projected to a predetermined distance from the other side of the lower cladding layer. The light connecting bump can be formed with the lower cladding layer as a single body.

One end of the light connecting bump can have a curved surface having a predetermined radius of curvature, and the first reflecting surface and the second reflecting surface can have reflecting angles of 45° and can face each other. The upper cladding layer and the core layer can have an air layer which exposes the first reflecting surface and the second surface to the exterior, where the air layer can be sealed by a protective film.

One aspect of the invention provides a fabricating method for an optical printed circuit board, which includes forming a hole in a metal foil and forming a light connecting bump by stacking a lower cladding layer to fill the hole, stacking a core layer on the lower cladding layer and forming a first reflecting surface and a second reflecting surface corresponding to the hole respectively, and stacking an upper cladding layer on the lower cladding layer and forming a circuit pattern on the metal foil.

Another aspect of the invention provides a fabricating method for an optical printed circuit board, which includes forming a hole in a metal foil and forming a light connecting bump by stacking a lower cladding layer to fill the hole, stacking a core layer and an upper layer in sequence and forming a circuit pattern on the metal foil, and forming a first reflecting surface and a second reflecting surface corresponding to the hole by forming an air layer in the core layer and the upper cladding layer.

A method of fabricating an optical printed circuit board according to certain embodiments of the invention may include one or more of the following features. For example, one end of the light connecting bump can have a curved surface having a predetermined radius of curvature. The first reflecting surface and the second reflecting surface can have reflecting angles of 45° and can face each other. The air layer can be sealed by a protective film.

DETAILED DESCRIPTION

Embodiments of the invention will be described below in more detail with reference to the accompanying drawings. In the description with reference to the accompanying drawings, those components are rendered the same reference number that are the same or are in correspondence regardless of the figure number, and redundant explanations are omitted.

Figure 1:
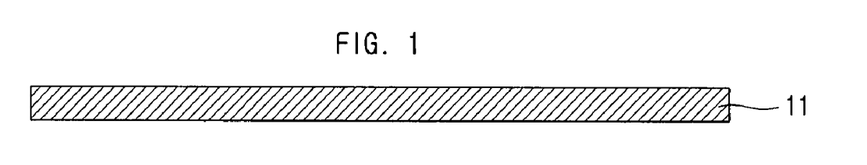
FIG. 1 is a cross-sectional view of a metal foil on which a circuit pattern is formed according to one embodiment of present invention.

As illustrated in FIG. 1, a metal foil 11 is provided on which a circuit pattern (not illustrated) is formed by a subsequent process. The metal foil 11 may have a thickness of several to several tens of micrometers and may be made of copper or aluminum, etc. One side of the metal 11 may be given roughness to increase adhesive strength between the metal foil 11 and a lower cladding layer, and the lower cladding layer may be stacked on the roughened metal foil 11. If the metal foil 11 is a copper sheet, brown black oxide treatment may be performed to increase the roughness.

Figure 2:
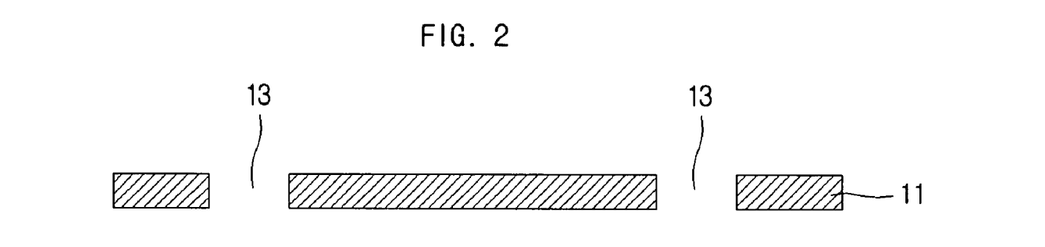
FIG. 2 is a cross-sectional view in which holes are formed in the metal foil in FIG. 1.

FIG. 2 is a cross-sectional view in which a pair of holes 13 are formed in the metal foil 11 illustrated in FIG. 1.

Referring to FIG. 2, the holes 13 are perforated to a predetermined distance. Because the positions of the holes 13 correspond to the positions of light connecting bumps formed by a subsequent process, the holes 13 may advantageously be processed with precision. The holes 13 may be formed using a laser drill or a mechanic drill, etc. The holes 13 can have various shapes such as circles or ellipses, etc., as long as the holes 13 do not obstruct the path of the light reflected on the first or second reflecting surface.

Figure 3:
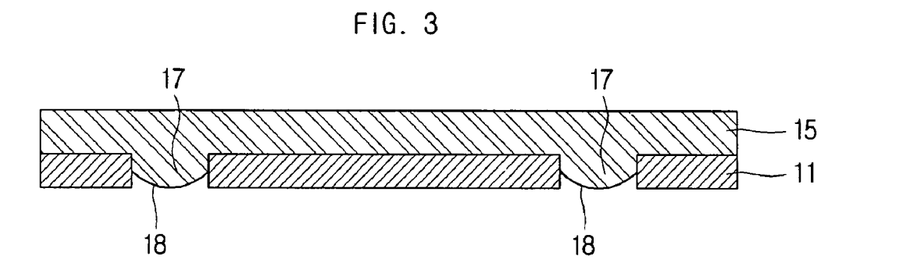
FIG. 3 is a cross-sectional view in which a lower cladding layer is stacked on to fill the holes of the metal foil in FIG. 2.

FIG. 3 is a cross-sectional view in which a lower cladding layer 15 is formed on a surface of the metal foil 11 of FIG. 2.

Referring to the FIG. 3, the lower cladding layer 15 may be formed by applying a cladding using a laminating method, rolling method, screen printing, or spraying method, and then drying and hardening at a predetermined temperature.

The rolling method is to use rollers to spread a cladding, supplied by pumping from a container filled with a liquid photo-resist polymer, on the metal foil 11 fed by a feeding means. The lamination method is of forming a cladding layer by coating a cladding, supplied from a cylinder roll wound with cladding material, onto the metal foil 11 fed by a feeding means. In addition, the screen printing method is of applying a cladding on the metal foil 13, which forms the lower cladding layer 15, with a screen printing plate. The spraying method is of spraying the cladding on the metal foil 13 with a spray.

Here, the cladding may be filled in the hole 13 formed in the metal foil 11 and hardened, so that light connecting bumps 17 may be formed. The lower cladding layer 15 may be formed to have a lower refractive index than that of the core layer 19. Accordingly, the light energy irradiated on the core layer 19 may not be emitted to the exterior of the printed circuit board.

Figure 7:
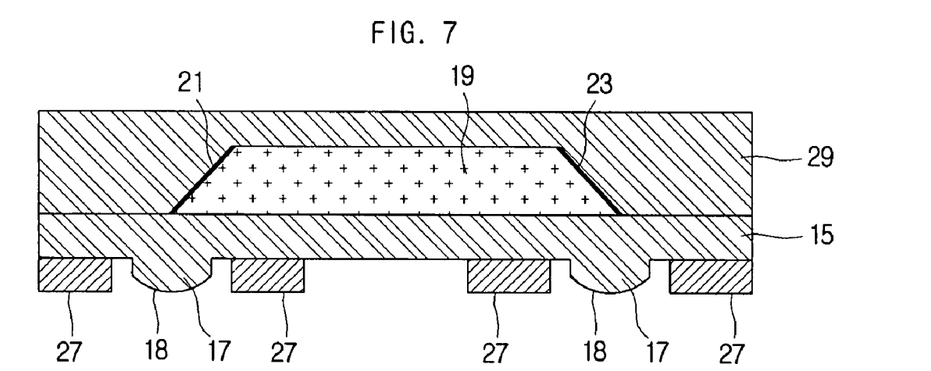
FIG. 7 is a cross-sectional view in which a circuit pattern is formed by processing the metal foil in FIG. 6.

In this manner, the light connecting bump 17 may be formed as a single body with the lower cladding layer 15 and may protrude downwards. A circuit pattern may be formed in the vicinity of the light connecting bump 17, as in FIG. 7. The circuit pattern may decrease the gap between the photodiode or VCSEL of the receipt chip or the transmission chip mounted on the circuit pattern and the lower cladding layer 15 to increase optical connection efficiency. The ends of the light connecting bumps 17 can have predetermined radii of curvature. That is, after the spreading, printing, drying, and hardening of the cladding, one end of the light connecting bump 17 may be processed as a curved surface 18 having a predetermined shape. The curved surface 18 may serve as a lens to focus the light from the light emitting diode.

Figure 4:
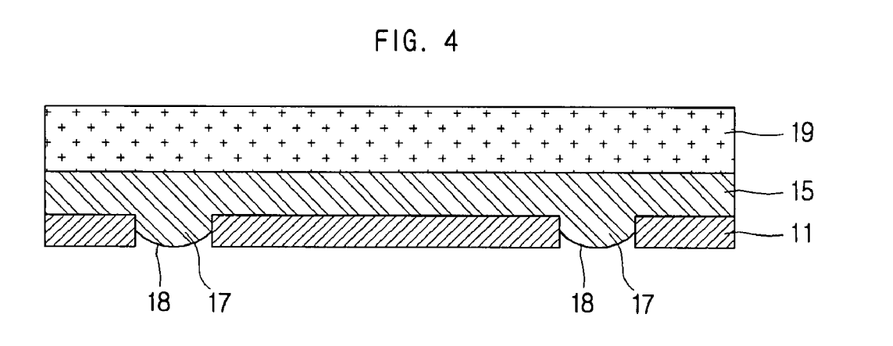
FIG. 4 is a cross-sectional view in which a core layer stacked on the lower cladding layer in FIG. 3.

FIG. 4 is a cross-sectional view in which a core layer 19 is stacked on the lower cladding layer 15.

The core layer 19 may be composed of a polymer material, which has better workability and lower cost than inorganic material, as well as an inorganic material, such as quartz glass or multi-ingredient glass, which has a wide transmission band. The polymer material can include polymethyl methacrylate (PMMA) or polystyrene. The core layer 19 may be formed by applying and drying a liquid polymer, using a laminating method, rolling method, or squeeze printing method, etc. The core layer 19 may be formed to have a higher refractive index than those of the lower cladding layer 15 and the upper cladding layer 29 described later, so that the optical signals undergo total reflection in the lower cladding layer 15 and the upper cladding layer 29 to be guided through the core layer 19.

Figure 5:
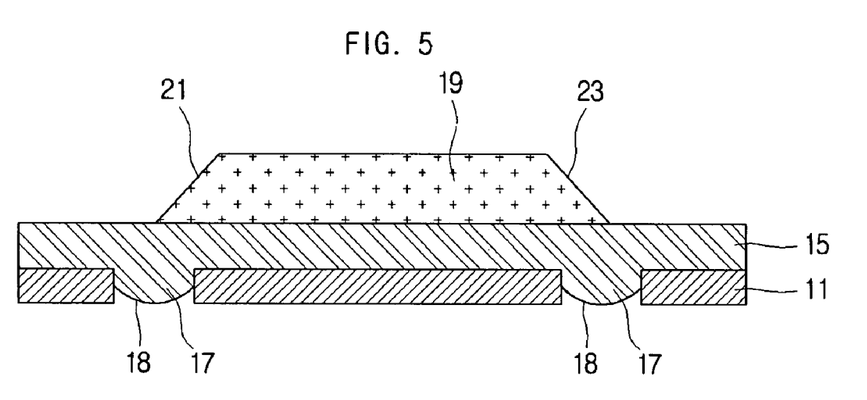
FIG. 5 is a cross-sectional view in which a first reflecting surface and a second reflecting surface are formed by processing the ends of the core layer in FIG. 4.

FIG. 5 is a cross-sectional view in which both ends of the core layer 19 are processed to form a first reflecting surface 21 and a second reflecting surface 23.

Referring to FIG. 5, the first reflecting surface 21 and the second reflecting surface 23 may be formed in correspondence to the positions of the light connecting bumps 17. That is, the positions of the first refracting surface 21 and the second refracting surface 23 may be adjusted, so that the light incident on the core layer 19 through the light connecting bump 17 and the light guided by the core layer 19 may be reflected on the first reflecting surface 21 and the second reflecting surface 23. Because the first reflecting surface 21 and the second reflecting surface 23 may be formed to have 45° reflection angles with respect to the paths of light, the light transmitted through the light connecting bumps 17 may be refracted twice by the first reflecting surface 21 and the second reflecting surface 23. The first reflecting surface 21 and the second reflecting surface 23 may be formed by a method of grooving with a diamond blade. Also, metal coating may be formed on the first reflecting surface 21 and the second reflecting surface 23 to increase reflection efficiency.

Figure 6:
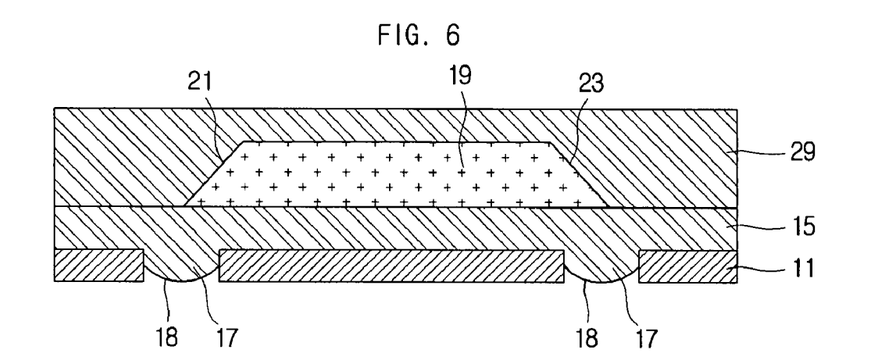
FIG. 6 is a cross-sectional view in which an upper cladding layer is stacked on the core layer in FIG. 5.

FIG. 6 is a cross-sectional view with an upper cladding layer 29 stacked on.

Referring to FIG. 6, the upper cladding layer 29 may be stacked on the core layer 19 to accommodate the core layer 19. The upper cladding layer 29 may be formed by applying and drying a liquid cladding, using the lamination method, rolling method, or squeeze method, etc. Also, the upper cladding layer 29 may be formed to have a lower refractive index than that of the core layer 19, through which the optical signals pass, and may block the optical signals irradiated into the core layer 19 from being emitted to the exterior. After the upper cladding layer 29 is formed, as presented in FIG. 7, a circuit pattern 27 may be formed in the metal foil 11. A transmission chip and a receipt chip may be mounted on the circuit pattern 27 by subsequent processes.

Because the light coming from the photo diode or VCSEL of the transmission chip and the receipt chip have a property of diffusion, the bigger the gap between the lower cladding layer 15 and the photo diode or VCSEL, the more the light loss, resulting in decreased light connecting efficiency. However, the light connecting bumps 17 according to this embodiment of the present invention may decrease the gap between the lower cladding layer 15 and photo diode or VCSEL, so that optical connection efficiency can be increased.

The conventional optical printed circuit board has a roughened surface formed on the metal foil 11 to facilitate attachment between the lower cladding layer 15 and the metal foil 11, where the light coming from the photo diode or VCSEL is reflected diffusedly on the roughened surface to result in light loss. However, in an optical printed circuit board according to an embodiment of the present invention, the light connecting bumps 17 may receive the light to decrease the light loss.

Figure 8:
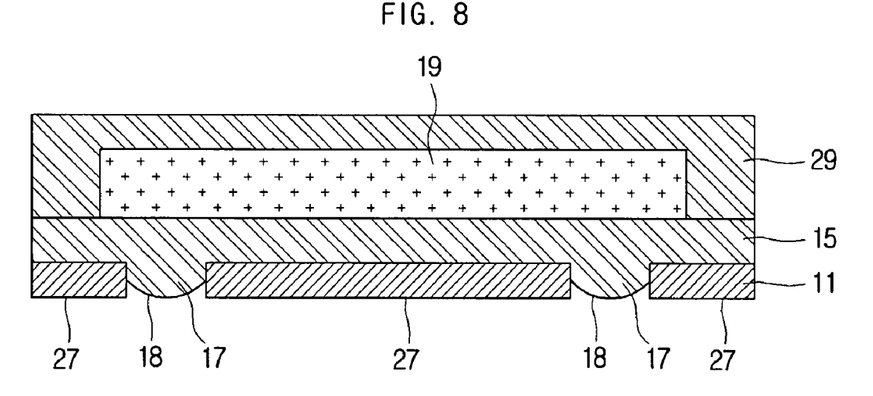
FIG. 8 is a cross-sectional view of a metal foil having holes, a lower cladding layer, and an upper cladding layer stacked in sequence according to another embodiment of the present invention.
Figure 9:
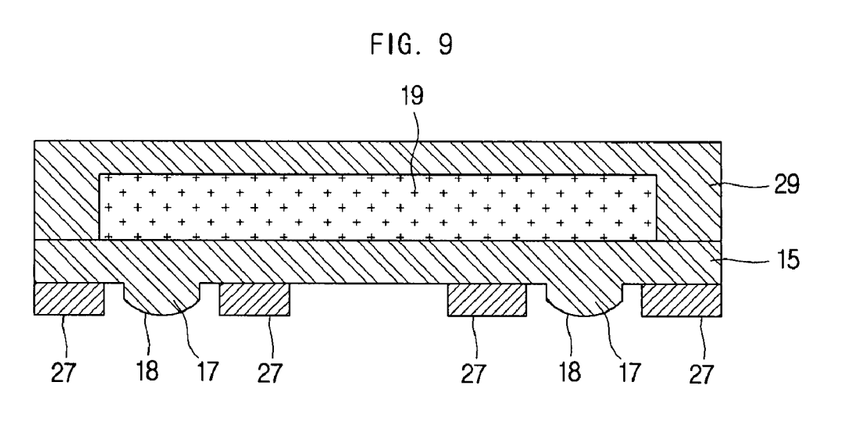
FIG. 9 is a cross-sectional view in which a circuit pattern is formed in the metal foil in FIG. 8.
Figure 10:
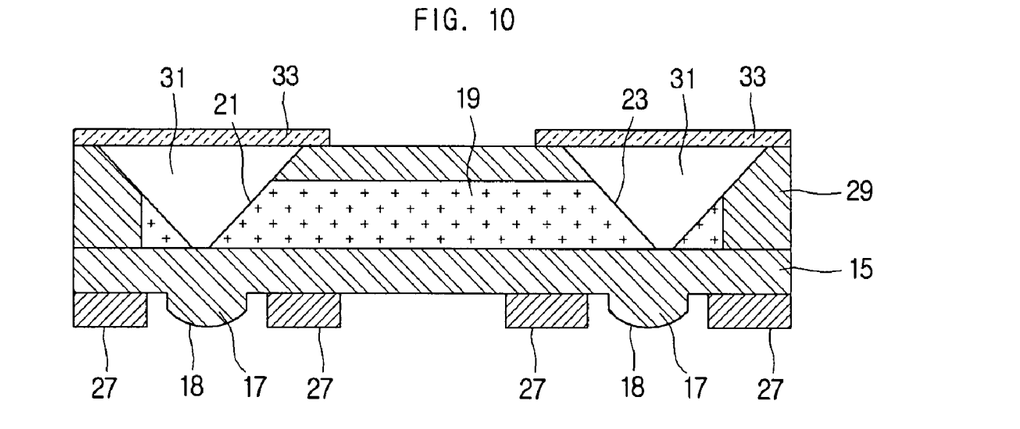
FIG. 10 is a cross-section view in which an air layer is sealed by a protective film in FIG. 9.

FIG. 8 to FIG. 10 are cross-sectional views representing a method of fabricating an optical printed circuit board according to another embodiment of present invention. In this embodiment, the first reflecting surface 21 and the second reflecting surface 23 may be formed by forming an air layer 31 with the core layer 19 and the upper cladding layer 29 stacked, instead of forming the first reflecting surface 21 and the second reflecting surface 23 before forming the upper cladding layer 29. Accordingly, the method of fabricating an optical printed circuit board according to this embodiment of the claimed invention has the same process described referring to FIG. 1 to FIG. 4, up until stacking the core layer 19 on the lower cladding layer 15.

Referring to FIG. 8, after the core layer 19 is stacked in the lower cladding layer 15, the upper cladding layer 29 may be stacked on the core layer 19 instead of processing the first and second reflecting surfaces. The upper cladding layer 29 may be formed by applying cladding which is to be dried and hardened, using the aforementioned lamination method, rolling method, screen printing method, or spray method, etc.

As illustrated in FIG. 9, a circuit pattern 27 may be formed on the metal foil 11. After a dry film is laminated on the metal foil 11 by a predetermined temperature and pressure, a working film may be laminated on the dry film, and irradiation of a predetermined intensity may be applied on the working film to form a pattern image. After a developing solution is used to remove parts of the dry film, the parts not covered by the dry film may be removed by way of an etching process. Finally, by removing the dry film with NaOH or KOH, etc., the circuit pattern 27 may be formed.

FIG. 10 is a cross-section view in which a first reflecting surface and a second reflecting surface are formed by the forming of an air layer in FIG. 9.

Referring to FIG. 10, using a dicing machine set to 45 degrees, parts of the upper cladding layer 29 and the core layer 19 may be removed to form an air layer 31 having a "V" shape cross-section at both ends. Because of the air layer 31 thus structured, a first reflecting surface 21 and a second reflecting surface 23 may be formed which have reflecting surfaces of 45 degrees. Furthermore, by forming a metal coating with gold or silver on the first reflecting surface 21 and the second reflecting surface 23 to form a reflecting mirror, the air layer 31 may be sealed from the exterior by the protective film 33.

Figure 11:
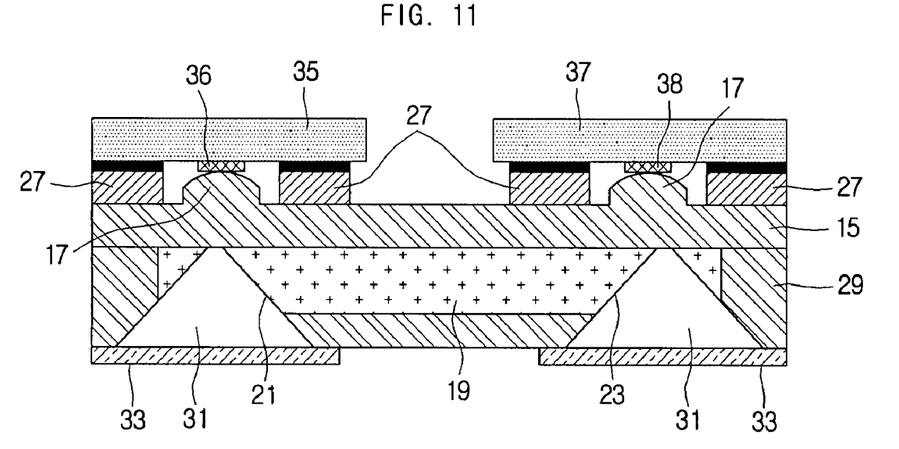
FIG. 11 is a cross-sectional view in which a transmission chip and receipt chip are mounted on the optical printed circuit board according to an embodiment of the present invention.

FIG. 11 is a cross-sectional view in which a receipt chip 35 and transmission chip 37 are mounted on an optical printed circuit board 10 according to an embodiment of the present invention.

Referring to FIG. 11, the receipt chip 35 and transmission chip 37 may be mounted on the circuit pattern 27 by way of solder balls. The receipt chip 35 may be connected to the photo diode 36 to amplify electrical signals. The photo diode 36 may convert the received optical signals to electrical signals. The transmission chip 37 may be connected to a VCSEL (Vertical-Cavity Surface-Emitting Laser) 38 to generate optical signals, where the VCSEL 38 is an active element that converts electrical signals to optical signals. In addition, a heat sink (not illustrated) can be disposed above the receipt chip 35 and the transmission chip 37 to emit the heat generated from the chips.

Regarding the operation of the optical printed circuit board 10 with reference to FIG. 11, an optical signal generated at the VCSEL 38 may be outputted to the light connecting bump 17 by the transmission chip 37. The optical signal entered through the light connecting bump 17 may be transmitted through the lower cladding layer 15 and reflected on the second reflecting surface 23, and the optical signal may undergo total reflection along the core layer 19 to be entered into the first reflecting surface 21. The optical signal may be reflected vertically on the first reflecting 21 to penetrate the lower cladding layer 15 and enter into the photo diode 36 through the light connecting bump 17. Here, the receipt chip 35 may convert the received optical signal to an electrical signal.

As described above, the gap between the VCSEL 38 and the light connecting bump 17 may be deceased, because the light connecting bump 17 may be protruded upward towards the VCSEL 38. Accordingly, the optical connection loss can be decreased by the light connecting bump 17. In addition, the gap between the photo diode 36 and the light connecting bump 17 may be decreased, because the light connecting bump 17 may be protruded upward towards the photo diode 36. Therefore, light from the light connecting bump 17 does not diffuse greatly, so that light loss can be decreased.

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. A method of fabricating an optical printed circuit board, the method comprising:
   forming a hole in a metal foil;
   forming a light connecting bump in the hole by stacking a lower cladding layer on the metal foil to fill the hole;
   stacking a core layer on the lower cladding layer and forming a first reflecting surface and a second reflecting surface corresponding to the hole, respectively; and
   stacking an upper cladding layer on the lower cladding layer and forming a circuit pattern on the metal foil.

2. The method of claim 1, wherein one end of the light connecting bump has a curved surface having a predetermined radius of curvature.

3. The method of claim 1, wherein the first reflecting surface and the second reflecting surface face each other and have reflecting angles of 45°.

4. A method of fabricating an optical printed circuit board, the method comprising:
   forming a hole in a metal foil;
   forming a light connecting bump in the hole by stacking a lower cladding layer on the metal foil to fill the hole;
   stacking a core layer and an upper layer in sequence;
   forming a circuit pattern on the metal foil; and
   forming a first reflecting surface and a second reflecting surface corresponding to the hole by forming an air layer in the core layer and the upper cladding layer.

5. The method of claim 4, wherein one end of the light connecting bump has a curved surface having a predetermined radius of curvature.

6. The method of claim 5, wherein the air layer is sealed by a protective film.

7. The method of claim 4, wherein the first reflecting surface and the second reflecting surface face each other and have reflecting angles of 45°.

* * * * *